(12) United States Patent
Pan

(10) Patent No.: US 7,487,415 B1
(45) Date of Patent: Feb. 3, 2009

(54) MEMORY CIRCUITRY WITH DATA VALIDATION

(75) Inventor: Philip Pan, Fremont, CA (US)

(73) Assignee: Altera Corporation, San Jose, CA (US)

( * ) Notice: Subject to any disclaimer, the term of this patent is extended or adjusted under 35 U.S.C. 154(b) by 837 days.

(21) Appl. No.: 10/956,984

(22) Filed: Oct. 1, 2004

(51) Int. Cl.
*G01R 31/28* (2006.01)

(52) U.S. Cl. .................. 714/724; 714/725; 714/718

(58) Field of Classification Search .............. 714/724, 714/725, 736, 746, 730, 718, 735, 757; 326/38
See application file for complete search history.

(56) References Cited

U.S. PATENT DOCUMENTS 4,855,954 A * 8/1989 Turner et al. ............... 326/38
4,896,296 A * 1/1990 Turner et al. ............... 326/38
7,225,373 B1 * 5/2007 Edwards et al. ............ 714/725

* cited by examiner

*Primary Examiner*—M. Mujtaba K Chaudry
*Assistant Examiner*—Fritz Alphonse
(74) *Attorney, Agent, or Firm*—Ropes & Gray LLP; Robert R. Jackson

(57) ABSTRACT

Memory circuitry is augmented with data validation circuitry that is closely coupled to the memory circuitry so that data read out of the memory for use in a validation operation does not have to pass through or to general-purpose routing or logic circuitry before it can be used by the data validation circuitry. The data validation circuitry compares the data read from the memory to other signals to determine whether or not there is a match. The data validation circuitry is preferably programmable to select which bits of a word read from the memory will actually be used in the data validation operation.

18 Claims, 5 Drawing Sheets

US 7,487,415 B1

MEMORY CIRCUITRY WITH DATA VALIDATION

BACKGROUND OF THE INVENTION

This invention relates to memory circuitry, and more particularly to the addition of data validation to such circuitry.

Programmable logic devices ("PLDs") frequently include blocks of memory. A task that may need to be performed using a PLD with such memory is comparison of a data word read from the memory with another data word in the PLD circuitry to determine whether or not the two words are the same (a "hit") or not the same (a "miss"). The purpose of this may be to "validate" either the word read from the memory or the other word in the PLD circuitry. Such validation is generally assumed to have occurred when the two words are found to be the same (i.e., there is a hit); but as an alternative, validation could instead be set up to require a miss.

Validation is typically performed in a PLD by reading a word from the memory and routing that word to programmable logic circuitry of the PLD. The other word to be compared to the memory word is also routed to that programmable logic circuitry, which has been programmed to perform the required comparison (validation) of the two words. The delay in handling the memory word in this way (e.g., the propagation delay through the routing circuitry from the memory to the programmable logic circuitry) can be undesirable in certain applications. For example, this delay may mean that the results of the validation operation are not available until one or more clock cycles after the clock cycle in which the data is read from the memory. This delay may be unacceptable or at least undesirable in applications such as high-speed data communication.

SUMMARY OF THE INVENTION

In accordance with the principles of this invention, data validation circuitry is added to memory circuitry so that data validation can be performed much more rapidly, e.g., in the same clock cycle in which data involved in the validation is read from the memory. The data validation circuitry is preferably capable of being substantially directly responsive to output signals of the sense amplifiers of the memory, and is also preferably capable of operating on those output signals without requiring them to be registered. The data validation circuitry may include, preferably as a selectable alternative, the ability to use register circuitry (e.g., in an input/output ("I/O") interface of the memory) to register the sense amplifier output signals prior to use of those signals in a data validation operation. The source of the other data to be compared to the memory output signals in the data validation operation may be other circuitry of the device that includes the memory. For example, this other circuitry may be programmable logic circuitry and/or interconnect circuitry of the device. The data validation circuitry may include circuitry for selecting which bits of data read from the memory will be used in the data validation operation. This selection circuitry may be programmably controlled. The results of the data validation operation may be output from the data validation circuitry either unregistered or registered (e.g., using register circuitry in the I/O interface of the memory).

Further features of the invention, its nature and various advantages will be more apparent from the accompanying drawings and the following detailed description of the preferred embodiments.

DETAILED DESCRIPTION

Figure 1:
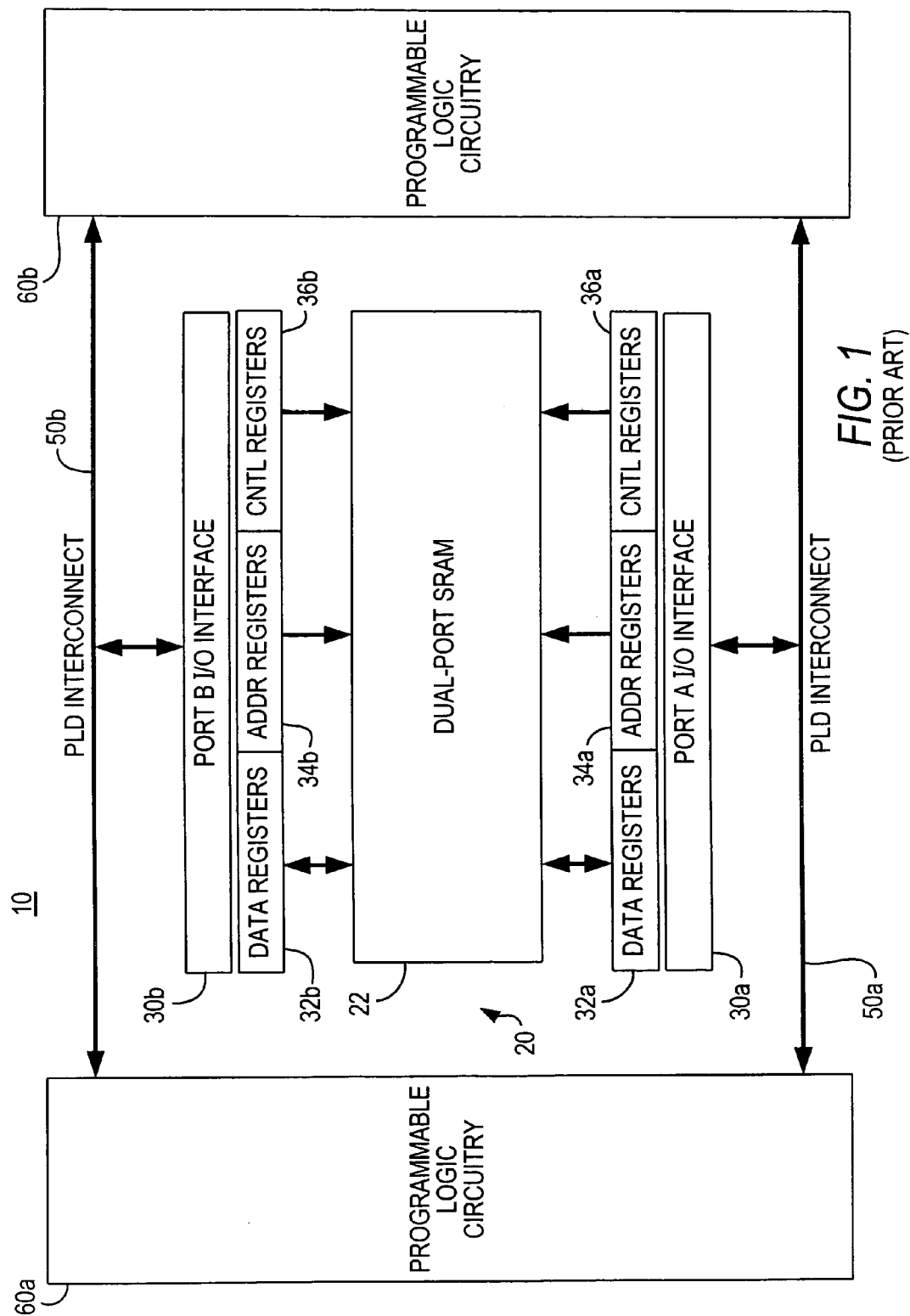
FIG. 1 is a simplified block diagram of illustrative prior art PLD circuitry including a memory block.

FIG. 1 shows illustrative prior art memory circuitry 20 on a PLD 10, which also includes programmable interconnect circuitry 50a/b and programmable logic circuitry 60a/b. In this example memory circuitry 20 includes a block 22 of dual-port static random access memory ("SRAM").

Each of the two ports of memory block 22 is served by a respective one of input/output ("I/O") interface circuits 30a and 30b. Each of I/O interface circuits 30a/b includes data registers 32a/b, address registers 34a/b, and control registers 36a/b. Data registers 32a/b store a word that is to be written into or that has been read from memory block 22. Address registers 34a/b store the address of the location in memory block 22 to which a word is to be written or from which a word is to be read. Control registers 36a/b store signals for controlling the operation of the circuitry (e.g., determining whether a read operation or a write operation will be performed).

Each of interface circuits 30a and 30b can exchange information with the adjacent interconnect (routing) circuitry 50a/50b. For example, each interface circuit 30 can receive address and data signals from the associated interconnect circuitry 50, and can output data signals to the associated interconnect circuitry. Interconnect circuitry 50 can exchange information with the programmable logic circuitry 60 of the PLD.

If data validation is required in circuitry of the type shown in FIG. 1, it is necessary to first read a word from an addressed location in memory block 22. The word thus read is stored in data registers 32a or 32b. In the next clock cycle that word can be routed via interconnect circuitry 50a or 50b to programmable logic circuitry 60. Programmable logic circuitry 60 is programmed to compare the word read from memory block 22 to another data word in the circuitry to determine whether these two words match (a hit) or do not match (a miss). All of this routing and comparing may require one or more additional clock cycles before programmable logic circuitry 60 can produce a signal indicative of whether there has been a hit or a miss (i.e., a data validation signal). As mentioned in the Background section of this specification, this much delay between reading a word from memory 22 for use in a data validation operation and the subsequent availability of the data validation signal may be unacceptable or at least undesirable in some applications.

Figure 2:
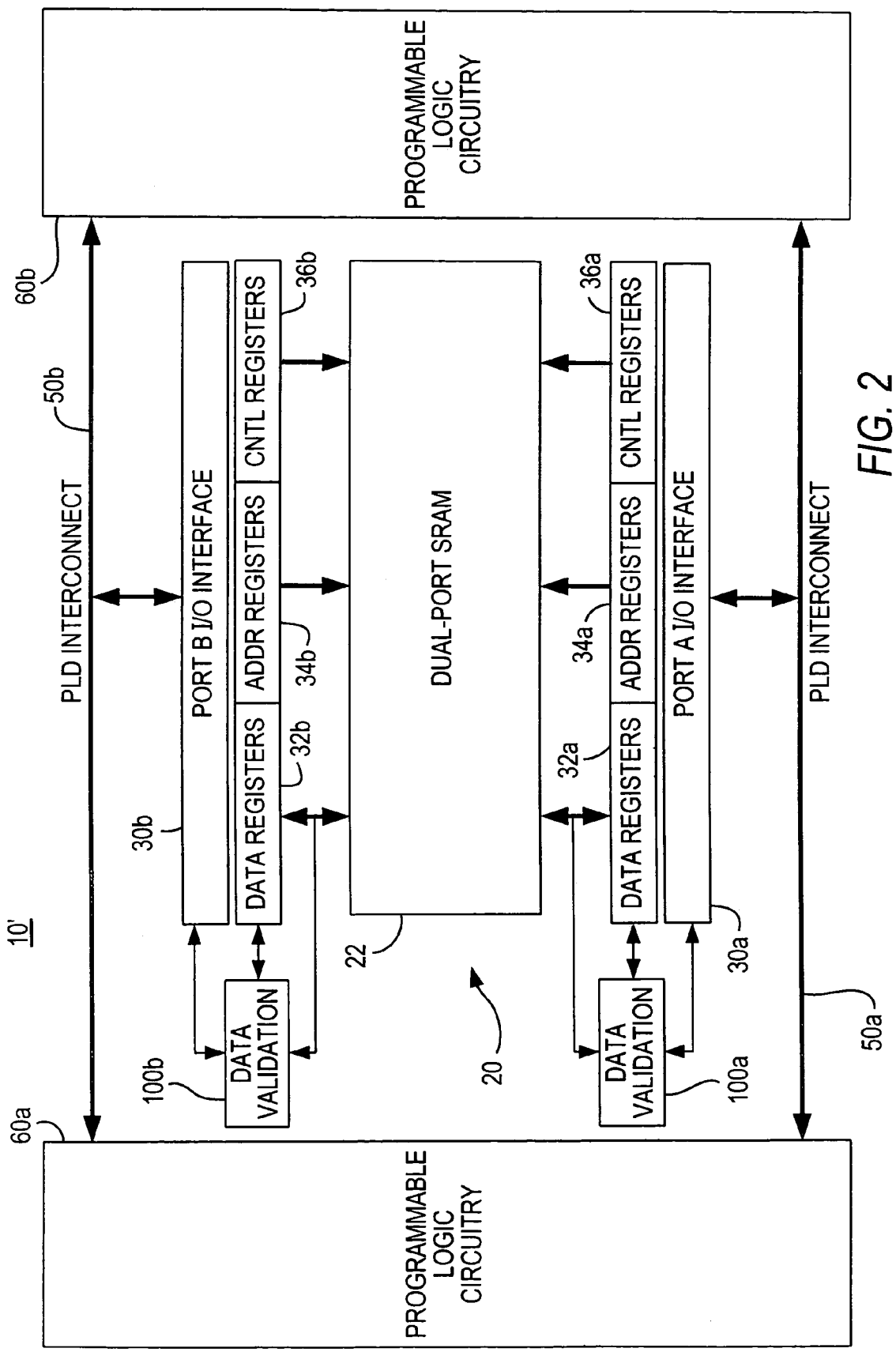
FIG. 2 is a simplified block diagram similar to FIG. 1 showing an illustrative embodiment of modifications of FIG. 1 type circuitry to include data validation circuitry in accordance with the invention.

An illustrative embodiment of PLD circuitry 10' that includes improved data validation circuitry in accordance with this invention is shown in FIG. 2. Elements in FIG. 2 that can be the same as elements in FIG. 1 have the same reference numbers in both FIGS. These repeated elements do not need to be described in detail again in connection with FIG. 2 because they have already been described in connection with FIG. 1. FIG. 2 shows the data validation circuitry 100a/100b of this invention connected in close association with memory block 22 and its associated I/O interfaces 30a and 30b. In particular, one instance of data validation circuitry 100 is provided for each I/O interface 30. It is not necessary to use general-purpose interconnect circuitry 50 or programmable logic circuitry 60 to convey or operate on data read from memory 22 as part of a data validation operation in accordance with the invention. The various connections between each instance of data validation circuitry 100 and the other circuitry shown in FIG. 2 will be fully understood from the more detailed depictions in subsequent FIGS. and the following description of those FIGS.

Figure 3:
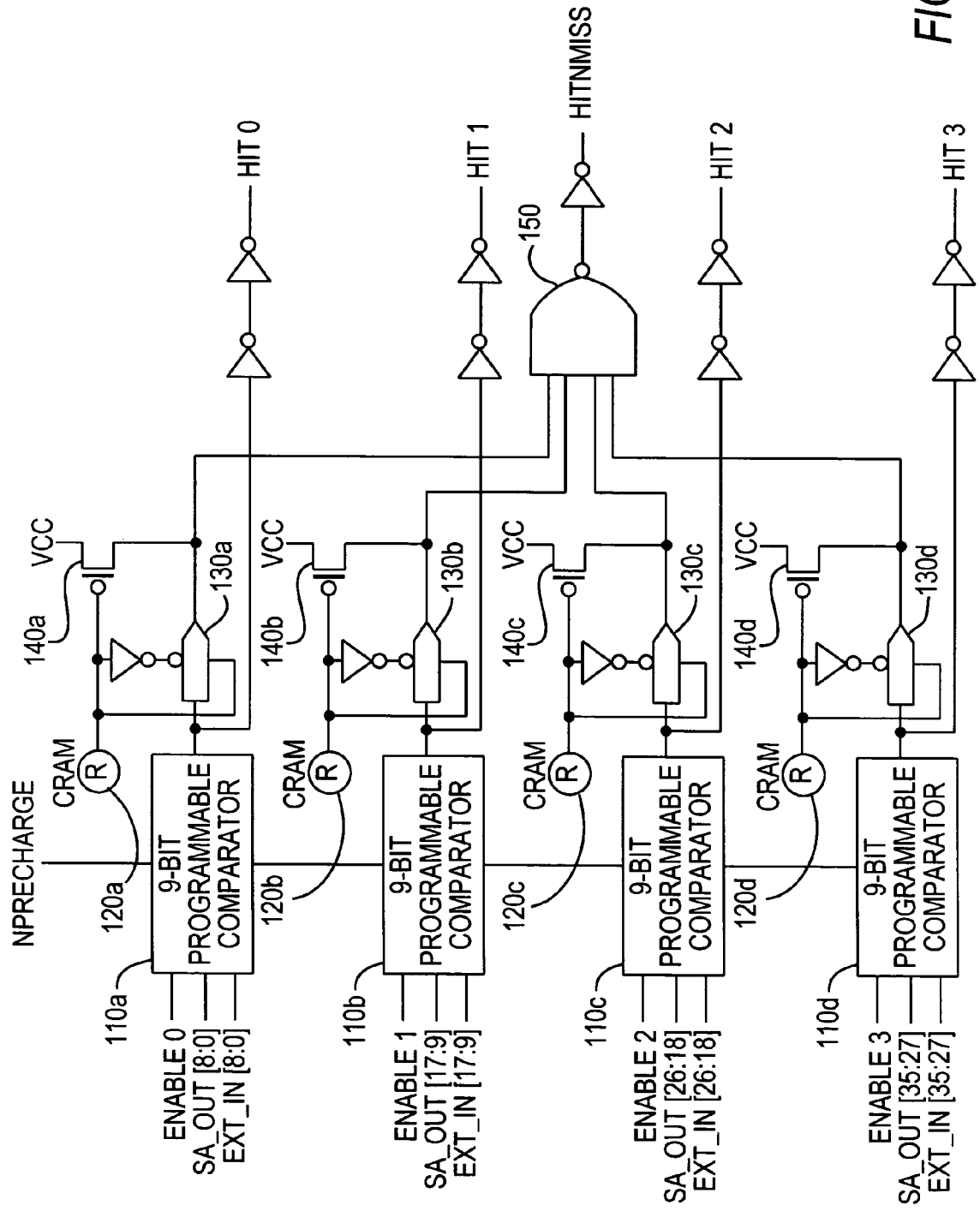
FIG. 3 is a simplified schematic block diagram showing in more detail an illustrative embodiment of a representative portion of the FIG. 2 circuitry in accordance with the invention.
Figure 5:
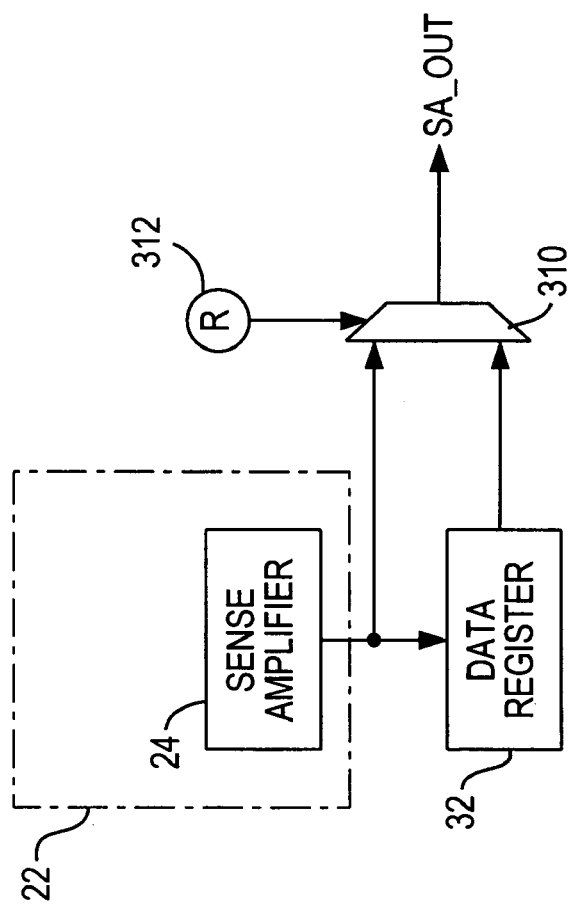
FIG. 5 is a simplified schematic block diagram of an illustrative embodiment of circuitry that can be included in circuitry of the type shown in FIGS. 2-4 in accordance with the invention.

A representative instance of an illustrative embodiment of data validation circuitry 100 is shown in FIG. 3. This circuitry includes four instances of nine-bit programmable comparator circuitry 110a-d. Each of comparator circuits 110 is capable of validating up to nine bits of data by comparing up to nine bits from the outputs of up to nine sense amplifiers ("SA") of memory block 22 (FIG. 2) with up to nine bits of other data ("Ext"). For example, comparator circuitry 110a can compare up to nine SA_out[8:0] bits with up to nine Ext_in[8:0] bits. The SA_out signals may come directly from the sense amplifiers of memory block 22 and may therefore be unregistered, or those signals may have been registered by the data registers 32 of the associated I/O interface. (See, for example, FIG. 5, which shows that a multiplexer ("MUX") 310, programmably controlled by a configuration RAM bit 312, may be used to select a representative SA_out signal from either a sense amplifier 24 output or a data register 32.) The Ext_in signals may come from programmable logic circuitry 60 (FIG. 2) via interconnect circuitry 50 and I/O interface circuitry 30.

Figure 6:
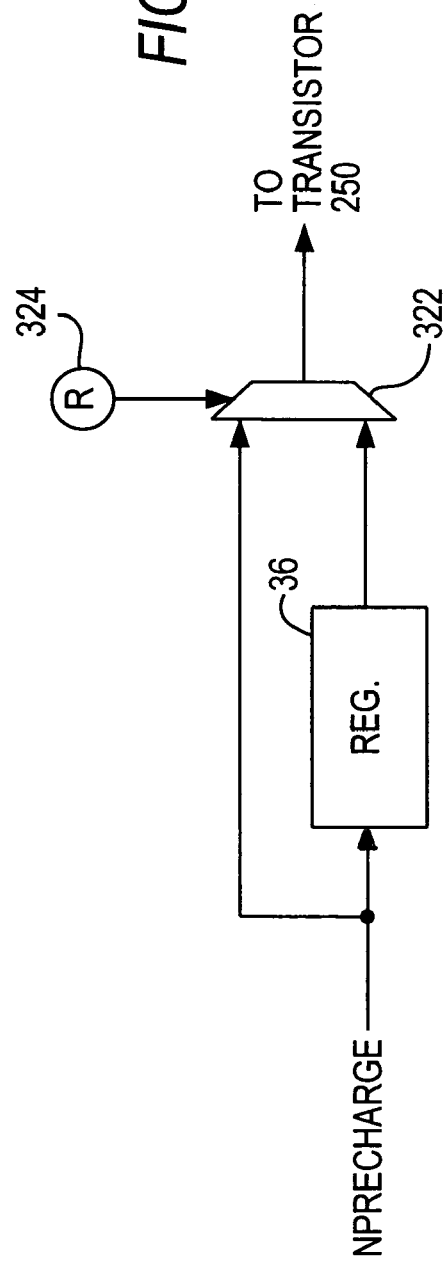
FIG. 6 is a simplified schematic block diagram of an illustrative embodiment of circuitry that can be included in circuitry of the type shown in FIGS. 2-4 in accordance with the invention.

To use circuitry 100 the Nprecharge signal must be enabling (logic 0 in this embodiment). (FIG. 6 shows that the Nprecharge signal may be either registered (e.g., by one of control registers 36) or unregistered. MUX 322, programmably controlled by configuration RAM bit 324, selects whether a registered or unregistered Nprecharge signal is used.) In addition, each of comparator circuits 110 makes its comparison of the data it receives when it receives its Enable signal (i.e., Enable0, Enable1, Enable2, or Enable3). Like Nprecharge, the Enable signals may be used in either static (registered) mode or dynamic (unregistered) mode. If Enable is static, then it may come from one or more of control registers 36 or any other suitably registered source. In the dynamic mode the Nprecharge and/or Enable signals have to be regulated by the control logic circuitry (e.g., including appropriate clock signal information) in control register box 36 before entering data validation circuitry 100 in order to synchronize with the data flow of SA_out and Ext_in.

Circuitry 100 is arranged to allow the various instances of comparator circuitry 110 to be used in any of several different ways. For example, each comparator circuit 110 can be used separately to produce a separate hit or miss signal Hit0, Hit1, Hit2, or Hit3. In addition, any of comparator circuits 110 can be used in combination to produce a hit or miss signal HitNMiss based on a comparison of the data bits fed to two or more of comparator circuits 110. To include any instance of comparator circuitry 110 in the circuitry that provides the HitNMiss signal, the configuration RAM ("CRAM") cell 120a-120d associated with that comparator circuit is programmed logic 1. This enables the associated pass gate circuitry 130a-130d and disables the associated pull-up transistor 140a-140d. This in turn allows the output signal of the associated comparator circuit 110 to be applied (via the associated pass gate circuitry 130) to the associated input of NAND gate 150. If it is not desired to include a particular comparator circuit 110 in the meaningful inputs to NAND gate 150, the CRAM cell 120 associated with that comparator circuit 110 is programmed logic 0. This disables the associated pass gate circuitry 130 and turns on the associated pull up transistor 140 to hold the associated input to NAND gate 150 at VCC or logic 1. This causes NAND gate 150 to effectively ignore that input.

The Hit0-Hit3 and HitNMiss output signals of circuitry 100 can be applied to the I/O interface circuitry 30 associated with that circuitry 100 or to any other desired destination. For example, any one or more of these data validation signals can be routed to associated registers such as data registers 32 for local registration, or can be routed out unregistered via associated I/O interface circuitry 30.

Figure 4:
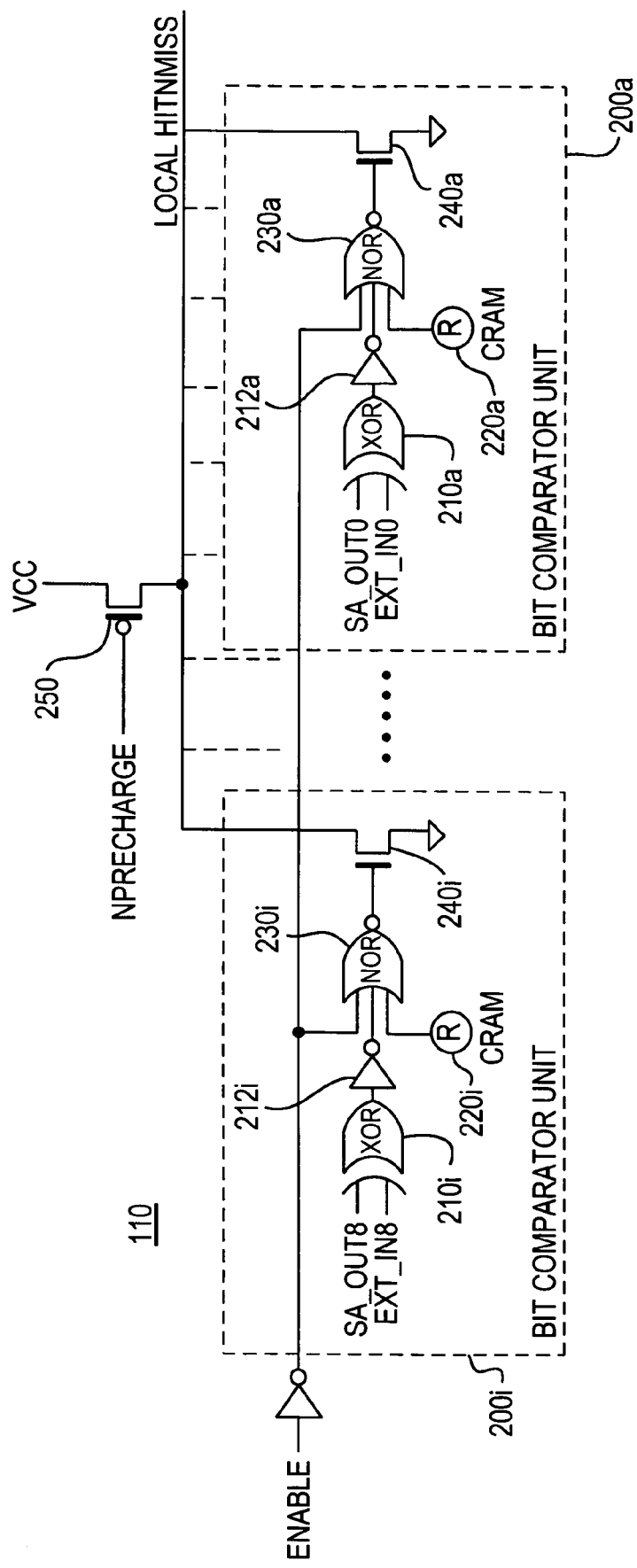
FIG. 4 is a simplified schematic block diagram showing in more detail an illustrative embodiment of a representative portion of the FIG. 3 circuitry in accordance with the invention.

An illustrative embodiment of a representative one of nine-bit programmable comparator circuits 110 is shown in FIG. 4. This circuitry includes nine instances of one-bit programmable comparator circuitry 200a through 200i (only representative instances 200a and 200i being shown). Each one-bit comparator circuit 200 includes an EXCLUSIVE OR ("XOR") gate 210 that compares one sense amplifier output signal from memory block 22 (FIG. 2) (e.g., SA_out0) and one bit of the other data word to be compared (e.g., Ext_in0). The output signal of an XOR gate 210 is logic 0 if there is a match between the input signals to that XOR gate, and it is logic 1 if there is a difference between these two input signals.

After logical inversion by an associated inverter 212, the output signal of each XOR gate 210 is one of the inputs to an associated NOR gate 230. A second input to each NOR gate 230 is the inverted Enable signal. This second input signal is logic 0 when the Enable signal is logic 1. A third input to each NOR gate 230 is the output signal of an associated configurable RAM cell 220. If it is desired to use a given one-bit comparator circuit 200, the CRAM cell 220 of that comparator circuit is programmed so that its output signal is logic 0. If it is not desired to use a given comparator circuit 200, the CRAM 220 of that comparator circuit is programmed so that its output signal is logic 1. Each of NOR gates 230 is enabled to pass (with inversion) the inverted output signal of the associated XOR gate 210 only when both of the other inputs to that NOR gate are logic 0. Inclusion of CRAMs 220 in the circuitry allows individual selection of which of comparator circuits 220 will actually be used. If a CRAM 220 is programmed to output logic 1, the associated comparator circuit 200 is effectively disabled and therefore not used. Only if a CRAM 220 is programmed to output logic 0 is the associated comparator circuit 200 enabled and therefore used.

If a comparator circuit 200 is not in use (because its CRAM 220 is outputting logic 1), then the output signal of its NOR gate 230 is logic 0 at all times. This holds off the associated transistor 240 and prevents that circuit 200 from having any effect on the level of the signal on the Local HitNMiss output lead of the associated nine-bit comparator circuit 110. (Elsewhere the signal called Local HitNMiss in FIG. 4 is any one of signals Hit0-Hit3.) On the other hand, if a comparator circuit 200 is in use (i.e., its CRAM 220 is outputting logic 0), then the associated NOR gate 230 is enabled to pass (with inversion) the inverted output signal of the associated XOR gate 210 whenever the inverted Enable signal becomes logic 0. If the inverted output signal of that XOR gate 210 is logic 1 (indicating that the two data signals applied to it are the same), then the output signal of NOR gate remains logic 0. This keeps the associated transistor 240 off, which prevents that comparator circuit 200 from affecting the level of the signal on the associated Local HitNMiss output lead. On the other hand, if the inverted output signal of an XOR gate 210 is logic 0 (indicating that the two data signals applied to that XOR gate are different from one another), then when the inverted Enable signal becomes logic 0, the output signal of the associated NOR gate 230 will immediately become logic 1. This turns on the associated transistor 240, which pulls the signal on the Local HitNMiss output lead to logic 0.

To summarize the foregoing, the Nprecharge signal is logic 0 at least when the data validation circuitry is being used. This turns on the weak pull up transistor 250 in each of nine-bit comparator circuits 110. With transistor 250 on, the Local HitNMiss output lead of each circuit 110 is pulled up to logic 1. If the transistors 240 in all of the one-bit comparator circuits 200 of a circuit 110 remain off, the signal on the Local HitNMiss output lead remains logic 1, indicating a hit condition. But if the transistor 240 in any of the circuits 220 in a circuit 110 is turned on, the signal on the Local HitNMiss output lead of that circuit 110 is immediately pulled down to logic 0, thereby indicating a miss condition.

The Enable signal may be timed to be asserted after sufficient time has passed to allow the output signals of the sense amplifiers of memory block 22 to stabilize during a memory read operation. This can be done in any of a number of ways, such as by deriving the Enable signal from a pair of self-timed dummy memory columns or a delay chain.

It will be understood that the foregoing is only illustrative of the principles of the invention, and that various modifications can be made by those skilled in the art without departing from the scope and spirit of the invention. For example, the number of bits compared in a data validation operation may be different from the number shown in the depicted illustrative embodiment. As another example of possible modifications, particular logic circuitry for comparing bits and managing static (CRAM 220) and dynamic (Enable) enables is shown and described herein, but any logically equivalent circuitry can be used instead if desired.

The invention claimed is:

1. Programmable logic device circuitry comprising:
    programmable logic circuitry;
    memory circuitry;
    programmable interconnect circuitry usable to convey signals between the programmable logic circuitry and the memory circuitry; and
    data validation circuitry associated with the memory circuitry for performing a parallel comparison of plural bits of a data word output by the memory circuitry and applied to the data validation circuitry in parallel to plural bits of another data word also applied to the data validation circuitry in parallel without having to pass the data word output by the memory circuitry through the programmable interconnect circuitry.

2. The circuitry defined in claim 1 wherein the data validation circuitry comprises selection circuitry for selecting which of the bits of the data word output by the memory circuitry will be compared to bits of the other data word.

3. The circuitry defined in claim 2 wherein the selection circuitry is programmable.

4. The circuitry defined in claim 1 wherein the memory circuitry comprises sense amplifier circuitry for producing output signals indicative of the bits output by the memory circuitry, and wherein the data validation circuitry is responsive to the output signals of the sense amplifier circuitry.

5. The circuitry defined in claim 4 wherein the data validation circuitry operates without registration of the output signals of the sense amplifier circuitry.

6. The circuitry defined in claim 1 wherein the memory circuitry comprises register circuitry for registering plural bits of a data word in parallel.

7. The circuitry defined in claim 6 wherein the register circuitry comprises a register that can be used to store, in parallel, plural bits of a data word read from the memory circuitry.

8. The circuitry defined in claim 7 wherein the register is alternatively usable to store signals output by the data validation circuitry.

9. Data validation circuitry comprising:
    memory circuitry for storing a plurality of plural bit data words, and for outputting in parallel the plural bits of any of those data words when that data word is addressed;
    data register circuitry for registering in parallel the plural bits of a data word that is output by the memory circuitry;
    multiplexer circuitry for outputting in parallel a selectable one of either (1) the plural bits of the data word that is output by the memory circuitry, or (2) the plural bits of the data word that is registered by the register circuitry; and
    signal comparison circuitry for performing a parallel comparison of the plural bits output by the multiplexer circuitry to plural bits of another data word also supplied to the signal comparison circuitry in parallel.

10. The circuitry defined in claim 9 wherein the signal comparison circuitry comprises selection circuitry for selecting which of the plural bits output by the multiplexer circuitry will be compared to the other data word.

11. The circuitry defined in claim 10 wherein the selection circuitry is programmable.

12. The circuitry defined in claim 9 wherein the memory circuitry comprises sense amplifier circuitry for producing output signals indicative of the plural bits of the data word output by the memory circuitry, and wherein the multiplexer circuitry can apply the output signals of the sense amplifier circuitry to the signal comparison circuitry.

13. The circuitry defined in claim 9 wherein the data register circuitry is alternatively usable for registering signals to be written to the memory circuitry.

14. Memory circuitry comprising:
    a block of memory capable of storing a plurality of plural bit words of data;
    address circuitry capable of causing the block of memory to output any one of the words of data in parallel when that word is addressed by the address circuitry;
    data validation circuitry capable of performing a parallel comparison between at least a portion of a word of data output by the block of memory to other signals supplied to the data validation circuitry in parallel without registration of that word, wherein the data validation circuitry comprises selection circuitry for each bit of the word of data output by the block of memory for selecting which of the bits will be compared to the other signals.

15. The circuitry defined in claim 14 wherein the selection circuitry is programmable.

16. The circuitry defined in claim 14 wherein the block of memory comprises sense amplifier circuitry for producing output signals indicative of the word of data output by the block of memory, and wherein the data validation circuitry is responsive to the output signals of the sense amplifier circuitry.

17. The circuitry defined in claim 14 further comprising register circuitry for selectively registering signals read from or to be applied to the block of memory.

18. The circuitry defined in claim 17 wherein the register circuitry is alternatively usable to store output signals of the data validation circuitry.

* * * * *